(12) United States Patent
Taniguchi (10) Patent No.: US 6,333,776 B1
(45) Date of Patent: *Dec. 25, 2001

(54) PROJECTION EXPOSURE APPARATUS (75) Inventor: Tetsuo Taniguchi, Ageo (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/184,877

(22) Filed: Nov. 3, 1998

Related U.S. Application Data (63) Continuation of application No. 08/710,960, filed on Sep. 24, 1996, now abandoned, which is a continuation-in-part of application No. 08/411,306, filed on Mar. 27, 1995, now Pat. No. 5,677,757.

(30) Foreign Application Priority Data

Sep. 26, 1995 (JP) .................................................. 7-247268

(51) Int. Cl.[7] ........................... G03B 27/68; G03B 27/42; G03B 27/72
(52) U.S. Cl. ................................ 355/52; 355/53; 355/71
(58) Field of Search ........................... 355/53, 67, 68, 355/69, 71, 77, 53.5, 52; 353/69; 359/559, 562, 564, 498, 499, 386, 387, 388

(56) References Cited

U.S. PATENT DOCUMENTS

| | | |
|---|---|---|
| 4,734,746 | 3/1988 | Ushida et al. . |
| 4,922,290 * | 5/1990 | Yoshitake et al. ................... 355/53 |
| 4,965,630 | 10/1990 | Kato et al. . |
| 5,105,075 | 4/1992 | Ohta et al. . |
| 5,117,255 | 5/1992 | Shiraishi et al. . |
| 5,184,176 * | 2/1993 | Unno et al. ............................. 355/52 |
| 5,311,362 | 5/1994 | Matsumoto et al. . |
| 5,392,119 | 2/1995 | McArthur et al. . |
| 5,436,692 * | 7/1995 | Noguchi ................................. 355/53 |
| 5,610,684 | 3/1997 | Shiraishi . |
| 5,640,233 | 6/1997 | McArthur et al. . |
| 5,677,757 | 10/1997 | Taniguchi et al. . |
| 6,104,472 * | 8/2000 | Suzuki ................................... 355/53 |
| 6,128,608 * | 10/2000 | Suzuki et al. ......................... 355/53 |

FOREIGN PATENT DOCUMENTS

| | | |
|---|---|---|
| 5-166699 | 7/1993 | (JP) . |
| 7-183190 | 7/1995 | (JP) . |
| 7-335516 | 12/1995 | (JP) . |

* cited by examiner

Primary Examiner—Russell Adams
Assistant Examiner—Rodney Fuller
(74) Attorney, Agent, or Firm—Oliff & Berridge PLC (57) ABSTRACT

A transparent correcting plate is disposed between a reticle and a projection optical system. The correcting plate can be selectively inserted and withdrawn by a changing device. The correcting plate can be changed for another correcting plate stored in a storage unit according to need. The correcting plate has been polished so as to be capable of correcting random distortion, and thus it corrects random distortion produced by a projection exposure apparatus in which it is used. Further, a correcting plate is selected according to image distortion characteristics of a projection exposure apparatus used in the preceding exposure process or a projection exposure apparatus to be used in the subsequent process, thereby correcting the distortion of a projected image, and thus improving the overlay accuracy between two layers.

29 Claims, 4 Drawing Sheets

PROJECTION EXPOSURE APPARATUS

This is a continuation application of U.S. patent application Ser. No. 08/710,960, which is a continuation-in-part application of U.S. patent application Ser. No. 08/411,306, which matured into U.S. Pat. No. 5,677,757.

BACKGROUND OF THE INVENTION

1. Field of the Invention

The present invention relates to a projection exposure apparatus used to transfer a mask pattern onto a photosensitive substrate in a photolithography process for producing, for example, semiconductor integrated circuits, liquid crystal display devices, imaging devices (e.g. CCDs), or thin-film magnetic heads. More particularly, the present invention relates to a projection exposure apparatus which is suitable for carrying out exposure for different layers on a photosensitive substrate by the mix-and-match method.

2. Related Background Art

In the production of semiconductor devices, for example, projection exposure apparatuses (e.g. steppers) have heretofore been used to transfer a pattern formed on a reticle, which is used as a mask, onto a photoresist-coated wafer through a projection optical system. In general, a semiconductor device is formed by stacking a plurality of layers of circuit patterns on a wafer with a predetermined positional relationship. In many of recent semiconductor manufacturing factories, exposure is carried out by the mix-and-match method mixedly using different projection exposure apparatuses for different layers on a wafer in order to increase the throughput (i.e. the number of wafers processed per unit time). Projection exposure apparatuses used in this process are stringently required to provide high overlay accuracy. Accordingly, each projection exposure apparatus is accurately corrected for image distortion such as distortion associated with a projection optical system. However, it is difficult to completely correct image distortion; some image distortion remains uncorrected. In this case, there may be intolerable variations of image distortion between projection exposure apparatuses even if the image distortion for each apparatus is within tolerance. Particularly, when projection exposure apparatuses differ from each other in the magnification of their projection optical systems and in the size of the exposure field, or when a system mixedly uses projection exposure apparatuses which have different dates of manufacture and hence are different in the tolerance standard for image distortion, there are image distortion variations as described above, and the overlay accuracy, i.e. matching accuracy, reduces.

To solve the above-described problems, Japanese Patent Application Unexamined Publication (KOKAI) Nos. 62-7129 and 62-24624 disclose an exposure method wherein the projection magnification of each apparatus is adjusted such that the overlay accuracy of a distorted image is optimized in each apparatus, and the exposure position is also corrected so as to be optimized. Japanese Patent Application Unexamined Publication (KOKAI) No. 4-127514 discloses a method wherein a reticle or an optical member, which forms a projection optical system, is three-dimensionally moved or tilted to correct anisotropic image distortion, thereby further improving the overlay accuracy. Japanese Patent Application Unexamined Publication (KOKAI) No. 5-166699 discloses a method wherein information concerning distortion in each projection optical system is controlled by a central processing unit so as to obtain the highest distortion matching accuracy between projection exposure apparatuses.

Image distortion components that can be corrected by the above-described conventional techniques are only predetermined symmetric components such as translation components correctable by correction of the exposure position, point symmetry components correctable by correction of the projection magnification, or line symmetry components correctable by correction of the tilt angle of an optical member in the projection optical system. Conventionally, attempts have been made to reduce the overlay error by making full use of techniques whereby such symmetric components alone are corrected. Therefore, correction has heretofore been made, for example, by calculating correction conditions which minimize the largest error in the amounts of displacement of a projected image relative to ideal lattice points, that is, the largest error of so-called distortion errors.

However, even if such a correction is made, it is impossible to avoid some image distortion in a projection optical system which consists of asymmetric random components due to refractive index nonuniformity based on the heterogeneity of a glass material which is difficult to remove or due to a local deviation of an optical member from a spherical surface caused during glass polishing process. In the past, it was rare for such random components to give rise to a problem in terms of the overlay accuracy. In recent years, however, as the pattern line width has become increasingly fine, the required overlay accuracy has become strict, and such random image distortion components have become a hindrance to the attainment of the required overlay accuracy.

When projection exposure apparatuses different from each other in the field angle (i.e. the size of the exposure field) are mixedly used, image distortion which has symmetry in each particular projection exposure apparatus may develop asymmetric image distortion in another projection exposure apparatus which differs from the first-mentioned apparatus in the field angle. In this case also, it is difficult with conventional techniques to obtain satisfactorily high matching accuracy, and similar problems arise.

SUMMARY OF THE INVENTION

In view of the above-described circumstances, an object of the present invention is to provide a projection exposure apparatus capable of obtaining high overlay accuracy even when it is mixedly used with a projection exposure apparatus in which asymmetric random image distortion remains.

The present invention provides a projection exposure apparatus wherein a pattern formed on a mask is projected onto a photosensitive substrate by exposure through a projection optical system. The projection exposure apparatus has an optical member which is provided between the mask and the projection optical system to generate image distortion according to image distortion characteristics of another exposure apparatus used to carry out exposure for the photosensitive substrate.

According to the projection exposure apparatus of the present invention, image distortion can be generated by the optical member in accordance with image distortion characteristics of another exposure apparatus. Therefore, high overlay accuracy can be obtained even when the projection exposure apparatus is mixedly used with another projection exposure apparatus in which image distortion, for example, asymmetric random image distortion, remains.

It is preferable to provide a device for selectively inserting and withdrawing the optical member into and from a bundle of image-forming light rays between the mask and the projection optical system. Thus, it is possible to provide a plurality of optical members corresponding to image distortion characteristics of various exposure apparatuses and to change optical members in accordance with the corresponding exposure apparatuses by the optical member inserting and withdrawing device.

One example of other exposure apparatuses mixedly used is an exposure apparatus used in the preceding exposure process.

Another example of other exposure apparatuses mixedly used is an exposure apparatus to be used in the subsequent exposure process.

BRIEF DESCRIPTION OF THE DRAWINGS

FIGS. 2(*a*), 2(*b*) and 2(*c*) are views for explanation of one example of a method of measuring image distortion in a projection optical system in the projection exposure apparatus shown in FIG. 1.

FIGS. 3(*a*), 3(*b*) and 3(*c*) are views for explanation of another example of an image distortion measuring method.

FIG. 4(*a*) shows one example of asymmetric residual distortion.

FIG. 4(*b*) is a sectional view showing the configuration of a plate for correcting the residual distortion shown in FIG. 4(*a*).

FIGS. 5(*a*) and 5(*b*) are views for explanation of a method of matching image distortions between projection exposure apparatuses different from each other in the size of the exposure field in the embodiment of the present invention.

DETAILED DESCRIPTION OF PREFERRED EMBODIMENTS

One embodiment of the projection exposure apparatus according to the present invention will be described below with reference to the accompanying drawings. In this embodiment, the present invention is applied to a stepper-type projection exposure apparatus in which a pattern on a reticle is transferred onto each shot area on a wafer through a projection optical system by one-shot exposure.

Figure 1:
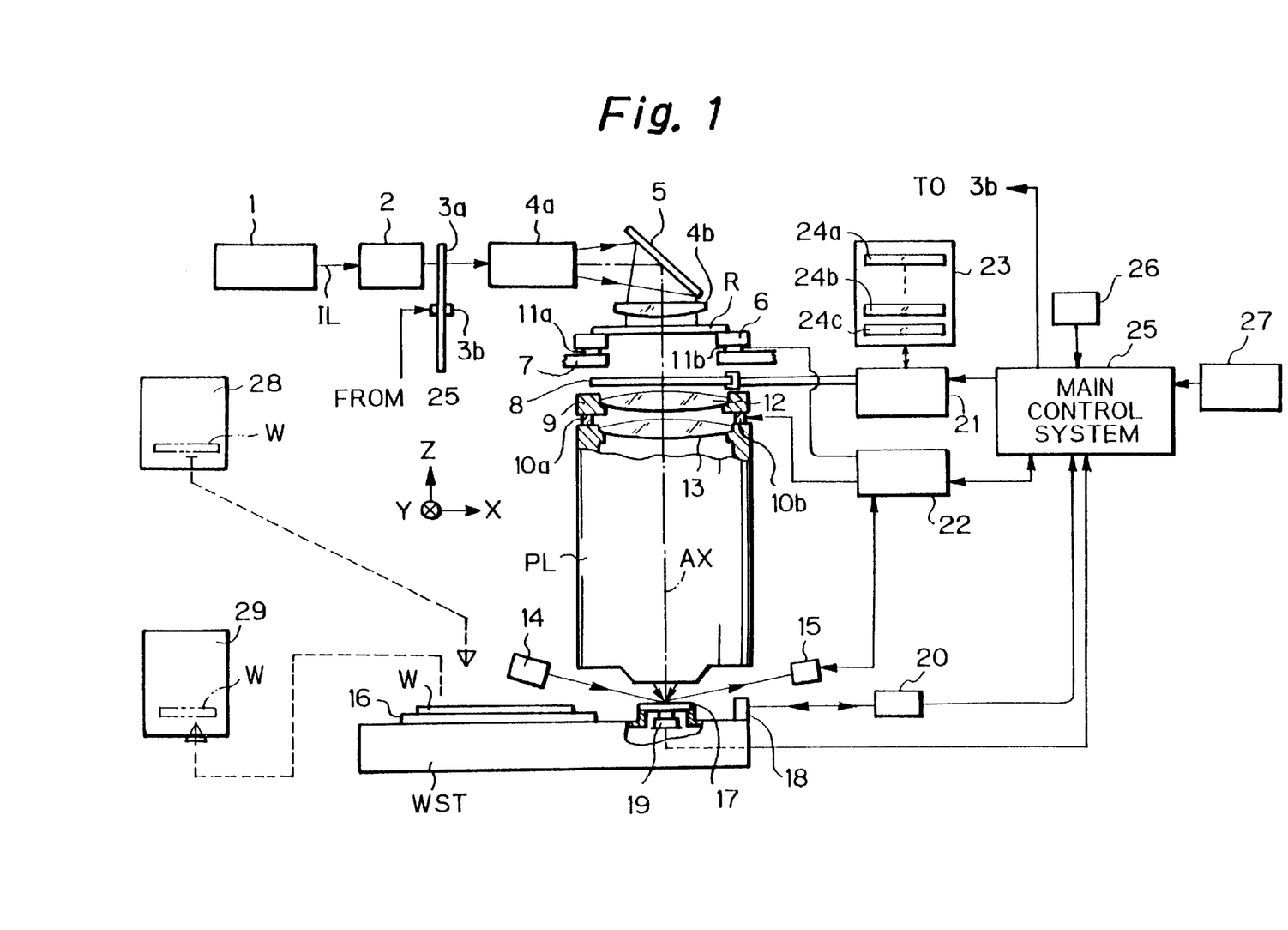
FIG. 1 schematically shows one embodiment of the projection exposure apparatus according to the present invention.

FIG. 1 schematically shows the arrangement of a projection exposure apparatus according to this embodiment. Referring to FIG. 1, illuminating light IL is generated in a light source 1. After passing through a shutter (not shown), the illuminating light IL is converted into a light beam having an approximately uniform illuminance distribution by an illuminance uniformizing illumination system 2 which includes a collimator lens, a fly-eye lens, etc. Examples of light usable as illuminating light IL are KrF excimer laser light, ArF excimer laser light, harmonics from a copper vapor laser and a YAG laser, and ultraviolet emission lines (g-line, i-line, etc.) from a super-high pressure mercury-vapor lamp.

Illuminating light IL passing through the illuminance uniformizing illumination system 2 enters a variable stop 3*a* for changing illumination conditions for a reticle R. The variable stop 3*a* is rotated by a driving system (revolver) 3*b* so as to set on the optical path of the illuminating light IL a stop selected from among an ordinary circular aperture, a small circular aperture, a stop for modified light source which comprises four small apertures decentered from the optical axis, and an annular stop. Thus, it is possible to select illumination conditions under which optimal image-formation characteristics can be obtained according to the conditions of patterns to be photolithographically transferred (i.e. line width, pitch, periodicity, isolation, etc.) by changing the numerical aperture of an aperture stop of the illumination system (i.e. σ value, which is the coherence factor of the illumination system) or selecting an annular illumination method or a modified light source method. During exposure, illuminating light IL passes through the variable stop 3*a* whereby predetermined illumination conditions are set. Then, the illuminating light IL passes through a relay lens 4*a* and is reflected by a dichroic mirror 5 to illuminate the reticle R through a condenser lens 4*b*. Under the illuminating light IL, a circuit pattern formed on the reticle R is projected onto each shot area on a wafer W as a reduced pattern image through a projection optical system PL with a projection magnification β (β is, for example, ⅕ or ¼). A Z-axis is taken in a direction parallel to the optical axis AX of the projection optical system PL. An X-axis is taken in a direction parallel to the plane of FIG. 1 in a plane perpendicular to the Z-axis. A Y-axis is taken in a direction perpendicular to the plane of FIG. 1.

The reticle R is held by vacuum on a reticle holder 6. The reticle holder 6 is mounted over a reticle stage 7 through extendable driving elements 11*a* and 11*b*. The drive of the reticle R (reticle holder 6) will be explained later in detail. The position of the reticle stage 7 is measured with a laser interferometer (not shown), and information concerning the measured position is sent to a main control system 25. The main control system 25 effects positioning of the reticle R through a reticle driving unit (not shown) and the reticle stage 7 on the basis of the position information.

The wafer W is held by vacuum on a wafer holder 16. The wafer holder 16 is retained on a wafer stage WST. The wafer stage WST drives the wafer W in directions X and Y in a step-and-repeat manner by a wafer stage driving unit (not shown) which includes a motor and other associated members. The wafer stage WST is arranged to be capable of tilting the wafer W in any direction with respect to the best focus plane of the projection optical system PL and also capable of slightly moving the wafer W in the direction of the optical axis AX (i.e. the direction Z). The wafer stage WST is also capable of rotating the wafer W about the optical axis AX within a predetermined range. A moving mirror 18 is fixed on an end portion of the wafer stage WST to reflect a laser beam from an laser interferometer 20. The position of the wafer stage WST in the XY-plane is constantly detected by the laser interferometer 20 at a resolution of the order of 0.01 μm, for example. Information concerning the position (or speed) of the wafer stage WST is sent to the main control system 25. The main control system 25 drives the wafer stage WST on the basis of the position information (or speed information).

Further, the projection exposure apparatus is provided with an oblique incidence type focus position detecting system for detecting the position (Z-position) of the wafer W in the direction of the optical axis AX (i.e. the direction Z). The focus position detecting system comprises a light-transmitting optical system 14 which obliquely illuminates the surface of the wafer W with detection light in the form of a slit-shaped or pinhole-shaped light spot, and a light-receiving optical system 15 which receives reflected light from the surface of the wafer W, re-forms an image of the light spot on an oscillating slit, and photoelectrically converts a bundle of rays passing through the oscillating slit to generate a detection signal. In the following description, the oblique incidence type focus position detecting system will be referred to as "focus position detecting system (14 and 15)". The detection signal is synchronously rectified to generate a focus signal. In the focus position detecting system (14 and 15), the angle of a plane-parallel glass (not shown) provided in the light-receiving optical system 15 has previously been adjusted such that the image-formation plane is a zero standard. Thus, automatic focusing is effected such that the focus signal from the light-receiving optical system 15 is zero. The focus signal from the focus position detecting system (14 and 15) is sent to the main control system 25 through an image-formation characteristic control system 22. When there is a change in the focus position of the image-formation plane in the image-formation characteristics, the main control system 25 finely adjusts the angle of the plane-parallel glass through the image-formation characteristic control system 22, thereby allowing the Z-position of the wafer W to follow up the image-formation plane. It should be noted that the tilt angle of the wafer W may be corrected according to an automatic leveling method by applying a plurality of light spots to the surface of the wafer W from the focus position detecting system (14 and 15).

Further, the wafer stage WST is provided thereon with a photoelectric detection system which is capable of measuring distortion. The photoelectric detection system photoelectrically detects a pattern on the reticle R through the projection optical system PL, as disclosed, for example, in Japanese Patent Application Unexamined Publication (KOKAI) No. 59-94032. The photoelectric detection system is used in a method wherein image-formation characteristics are measured by directly observing a spatial image formed through the projection optical system PL in contrast to a method wherein a change in image-formation characteristics is detected by calculation and corrected. As shown in FIG. 1, a pattern plate 17 is fixed on the wafer stage WST. A photoelectric sensor 19, e.g. a silicon photodiode, is disposed at the bottom of the pattern plate 17 to detect a bundle of rays passing through the pattern plate 17. Thus, images of fiducial marks on a reticle, which are projected through the projection optical system PL, are detected by the photoelectric sensor 19 through the pattern plate 17. A detection signal (information concerning the projected images of the fiducial marks) from the photoelectric sensor 19 is supplied to the main control system 25. The pattern plate 17 is installed such that the surface of the pattern plate 17 is approximately flush with the surface of the wafer W. The pattern plate 17 and the photoelectric sensor 19 constitute a photoelectric detection system. A method of measuring image-formation characteristics of the projection optical system PL by using the photoelectric detection system will be explained below. It should be noted that, in image-formation characteristic measurement, images of a plurality of fiducial marks formed on a reticle, which are projected through the projection optical system PL, are detected by the photoelectric detection system, and the distances between the projected images of the fiducial marks are precisely measured to detect image-formation characteristics of the projection optical system PL. Therefore, a test reticle having fiducial marks formed at accurate positions is used in place of the reticle R.

Figure 2A:
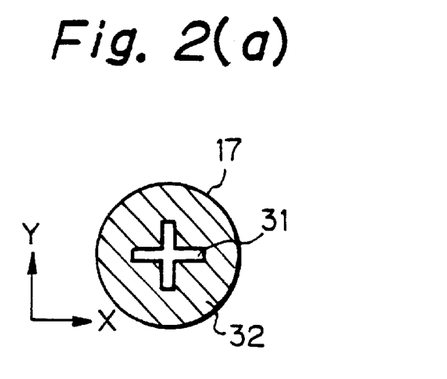

FIG. 2(a) is a plan view of a pattern plate 17 corresponding to the test reticle. Referring to FIG. 2(a), a circular pattern plate 17 has a light-transmitting portion 31 provided in the center thereof. The light-transmitting portion 31 is a cross-shaped slit surrounded by a light-blocking portion 32. The light-transmitting portion 31 has approximately the same size as that of an image of a fiducial mark 33 of a test reticle TR, shown in FIG. 2(b), as it is projected on the pattern plate 17.

Figure 2B:
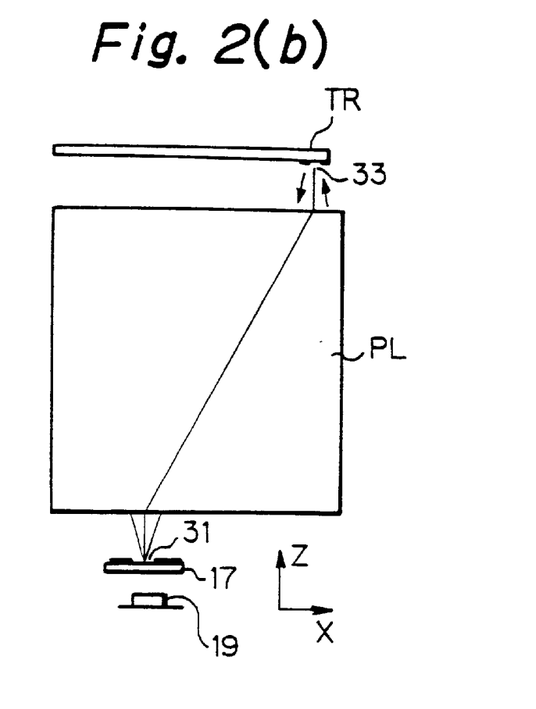

FIG. 2(b) shows the relationship between the test reticle TR and the photoelectric detection system on the wafer stage WST through the projection optical system PL. Referring to FIG. 2(b), the wafer stage WST, shown in FIG. 1, is driven such that the image-formation position of the fiducial mark 33 on the test reticle TR crosses the light-transmitting portion 31 of the pattern plate 17 in either the direction X or Y. An image of the fiducial mark 33, which is projected through the projection optical system PL, is measured by the photoelectric sensor 19 through the pattern plate 17. For example, when the wafer stage WST is moved in the direction X, the image of the fiducial mark 33 and the light-transmitting portion 31 of the pattern plate 17, which constitutes the photoelectric detection system, move relative to each other in the direction X.

Figure 2C:
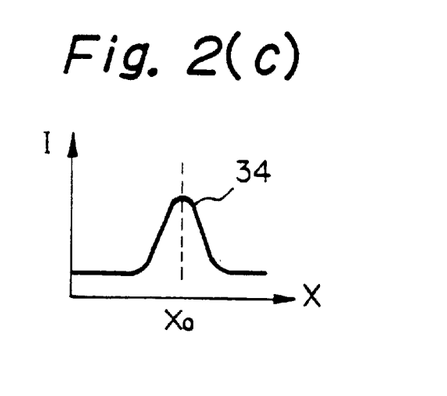

FIG. 2(c) is a graph showing the relationship between the position of the wafer stage WST and the amount of light received by the photoelectric sensor 19. The axis of abscissa represents the position x in the direction X of the wafer stage WST, and the axis of ordinate represents the detection signal I from the photoelectric sensor 19. When the wafer stage WST is moved in the direction X, a waveform curve 34 such as that shown in FIG. 2(c) is obtained. The center $x_0$ of the waveform curve 34 is measured as being the center of the image-formation position of the fiducial mark 33. It is possible to obtain an accurate image-formation position of the image of the fiducial mark 33 on the test reticle TR because the position of the light-transmitting portion 31 is precisely measured by the laser interferometer 20. It should be noted that measurement for the direction Y is similarly carried out.

It is possible to measure a magnification error and image distortion of the projection optical system PL by carrying out measurement for a plurality of fiducial marks on the test reticle TR as described above. Although in this embodiment each fiducial mark is a single line, marks each comprising a plurality of lines may be used to improve the measurement reproducibility. Although in this embodiment only one light-transmitting portion 31 is provided on the pattern plate 17, it is conceivable that a plurality of light-transmitting portions are provided on the pattern plate 17 in accordance with the number of fiducial marks on a reticle, and a plurality of points are measured by a single scan. In this case, if the distances between the adjacent light-transmitting portions have been accurately measured in advance, any error in measurement by the laser interferometer 20 has no effect on the accuracy of the measurement.

It is also possible to use a method in which the projected image of a fiducial mark on the test reticle TR is received by the photoelectric sensor 19 through a pattern plate having an approximately square opening, for example, in place of the slit-shaped light-transmitting portion 31.

Figure 3A:
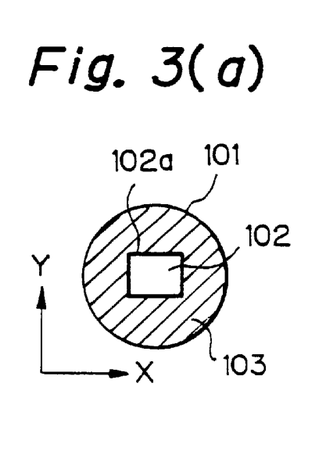

FIG. 3(a) is a plan view of a pattern plate 101 having a square opening. Referring to FIG. 3(a), a circular pattern plate 101 has a light-blocking portion 103 formed on a surface thereof. The light-blocking portion 103 is provided with a square opening 102 surrounded by two pairs of sides which are parallel to the directions X and Y, respectively. The widths of the sides of the opening 102, which extend in the direction X and Y, are slightly greater than the largest lengths in the directions X and Y of the projected image of the fiducial mark 33 on the test reticle TR. In the measuring method using the pattern plate 101, an edge 102a of the opening 102 which extends in the direction X is used, for example, as a reference for measurement in the direction X. If the wafer stage WST is scanned in the direction X by using the pattern plate 101, the amount of light incident on the photoelectric sensor 19 is measured as being an integrated light quantity. This will be explained below with reference to FIGS. 3(b) and 3(c).

Figure 3B:
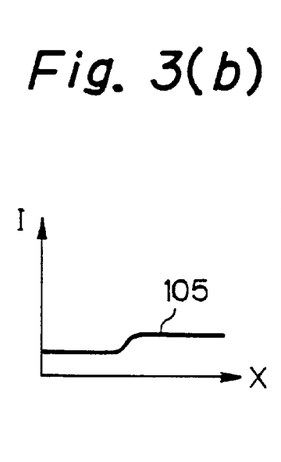
Figure 3C:
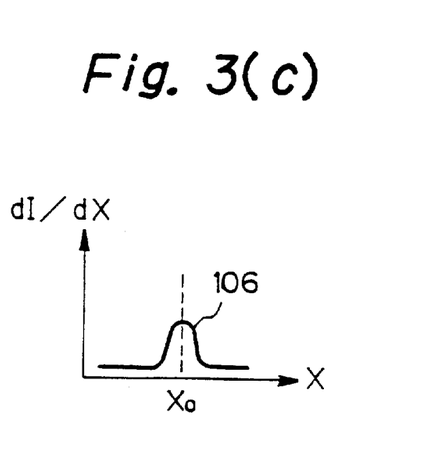

FIG. 3(b) shows a waveform curve 105 of a detection signal I from the photoelectric sensor 19. FIG. 3(c) shows a waveform curve 106 of a signal dI/dx obtained by differentiating the detection signal I from the photoelectric sensor 19, shown in FIG. 3(b), with respect to the position x of the wafer stage WST. It should be noted that in FIGS. 3(b) and 3(c) the axis of abscissa represents the position x. As the wafer stage WST moves, the detection signal I gradually increases and reaches a constant value at a certain position, as shown by the waveform curve 105 in FIG. 3(b). As the edge 102a of the opening 102 approaches the image-formation position, the angle of the rise of the detection signal I increases, and as the edge 102a comes away from the image-formation position, the angle decreases and converges to zero. That is, the photoelectric sensor 19 outputs a detection signal in the form of the integral of the waveform curve 34 shown in FIG. 2(c). Therefore, it is necessary to differentiate the detection signal to obtain an output signal equivalent to the waveform curve 34. The waveform curve 106 shown in FIG. 3(c) is obtained by differentiating the waveform curve 105 shown in FIG. 3(b) with respect to the position x of the wafer stage WST. Thus, an output signal equivalent to the waveform curve 34 in FIG. 2(c) is obtained. Accordingly, the image-formation position $X_0$ is calculated from the waveform curve 106, shown in FIG. 3(c), by a method similar to that described in connection with FIGS. 2(a) to 2(c). The method that uses the relatively large opening 102 as a light-transmitting portion is advantageous in that the required light quantity is minimized, and that the pattern plate 101 is easy to form, although the arithmetic processing becomes somewhat complicated. The method has another advantage that marks of various line widths can be measured by using a single light-transmitting portion. It is also possible to use a method in which a formed image is enlarged and measured with a photoelectric sensor capable of one- or two-dimensional measurement, e.g. a CCD. It is also possible to use a method in which image-formation characteristics are measured by actually exposing a reference pattern, that is, by carrying out test exposure.

Further, the apparatus shown in FIG. 1 is provided with a mechanism for correcting image-formation characteristics of the projection optical system PL. The correcting mechanism comprises a first correcting mechanism for correcting image-formation characteristics, mainly symmetric image distortion, and a second correcting mechanism for correcting image-formation characteristics, mainly asymmetric image distortion. First, the first correcting mechanism will be explained. Image-formation characteristics of the projection optical system PL include the focus position, field curvature, distortion (magnification error, image distortion, etc.), astigmatism, and so forth. There are conceivable mechanisms for correcting these image-formation characteristics, respectively. In the following, however, a mechanism for correcting distortion will be explained. In this embodiment, image-formation characteristics of the projection optical system PL are corrected on the basis of results of detection effected by the photoelectric detection system comprising the photoelectric sensor 19 and other members, and on the basis of the prediction of changes in the image-formation characteristics caused by an atmospheric pressure change, illuminating light absorption, a change of illumination conditions, etc.

In FIG. 1, the first correcting mechanism comprises a driving mechanism for the reticle R and a driving mechanism for a lens element 12 of the projection optical system PL which is the closest to the reticle R. That is, image-formation characteristics are corrected by driving the reticle holder 6 having the reticle R mounted thereon or the lens element 12 of the projection optical system PL through the image-formation characteristic control system 22.

First, the drive of the lens element 12 will be explained. In the projection optical system PL, the lens element 12, which is closest to the reticle R, is secured to a support member 9. A lens element 13 and others, which follow the lens element 12, are secured to the lens barrel body of the projection optical system PL. It should be noted that, in this embodiment, the optical axis AX of the projection optical system PL is the optical axis of an optical system constituting the main body of the projection optical system PL, which comprises the lens element 13 and other lens elements following it. The support member 9 is connected to the lens barrel body of the projection optical system PL through a plurality of extendable driving elements (two driving elements 10a and 10b of them are shown in FIG. 1) comprising piezoelectric elements. In this case, the lens element 12 can be moved parallel to the optical axis AX by extension and contraction of the driving elements 10a and 10b. It is also possible to tilt the lens element 12 relative to a plane perpendicular to the optical axis AX by independently extending and contracting three driving elements. By these operations, the first correcting mechanism can correct image-formation characteristics of the projection optical system PL, e.g. projection magnification, distortion, field curvature, astigmatism, etc.

When the lens element 12 moves parallel in the direction of the optical axis AX, the projection magnification of the projection optical system PL (i.e. the magnification of an image transferred from the reticle to the wafer) changes at a rate of change corresponding to the amount of movement of the lens element 12. When the lens element 12 tilts relative to a plane perpendicular to the optical axis AX, the projection magnification on one side of the axis of rotation of the lens element 12 enlarges, while the projection magnification on the other side reduces. Thus, it is possible to cause a deformation in which a square image is distorted in the shape of a trapezoid. Conversely, a trapezoidal distortion can be corrected by tilting the lens element 12.

Next, the drive of the reticle R will be explained. As described above, the distance between the projection optical system PL and the reticle R can be changed by extension and contraction of the driving elements 11a and 11b, which comprise piezoelectric elements provided at the bottom of the reticle holder 6. When the reticle R moves parallel to the optical axis AX, aberration which is called pin-cushion (or barrel) distortion can be introduced into the projected image. As the driving elements 10a and 10b for driving the lens element 12 in the projection optical system PL and the driving elements 11a and 11b for driving the reticle R, it is also possible to use electrostrictive elements or magnetostrictive elements in addition to piezoelectric elements.

Thus, the projection magnification or image distortion of the projection optical system PL can be optimally corrected by driving the reticle R or the lens element 12. Although the Z-position or tilt angle of the image-formation plane is changed by driving the reticle R or the lens element 12, the amount of change is fed back as an offset of the focus position detecting system (14 and 15) to effect control such that the Z-position of the surface of the wafer W is always coincident with an average Z-position of the image-formation plane of the projection optical system PL.

It should be noted that the first correcting mechanism for correcting the distortion of the projected image is not necessarily limited to the above-described mechanism. It is also possible to use other mechanisms, for example, a mechanism in which a glass plate locally and delicately curved to correct image distortion is inserted in a space between the projection optical system PL and the reticle R, or a mechanism in which a glass place (e.g. an optical wedge) having a variable thickness is inserted in a space between the projection optical system PL and the reticle R. The method that uses a glass plate having a variable thickness is approximately equivalent to the method wherein the reticle R is moved up and down, but it enables the same effect to be obtained without producing any adverse effect on the rigidity of the reticle stage 7. It is also possible to use various other methods which have heretofore been proposed, for example, a method in which a gas chamber between some lens elements of the projection optical system PL is hermetically sealed, and the pressure or the composition of air in the gas chamber is changed.

These first correcting mechanisms are usually used for correction of changes in image-formation characteristics caused by an atmospheric pressure change, absorption of illuminating light by the projection optical system PL, a change in illumination conditions, and so forth, in addition to correction of measured image-formation characteristics. This will be briefly explained below.

First, correction made in regard to an environmental condition change, e.g. an atmospheric pressure change, will be explained. The main control system 25 is supplied with information from an environmental sensor 26 comprising an atmospheric pressure sensor, a temperature sensor, etc. The main control system 25 calculates an amount of change of image-formation characteristics on the basis of the supplied information by use of coefficients or tables previously obtained by calculation or experiment. Further, the main control system 25 obtains amounts of correction for the driving elements 11a and 11b and other correcting devices. The result of the calculation is sent to the image-formation characteristic control system 22 as a control signal. The image-formation characteristic control system 22 drives the driving elements 10a and 10b or 11a and 11b on the basis of the control signal to control the lens element 12 or the reticle R.

Regarding the absorption of illuminating light by the projection optical system PL, an amount of illuminating light passing through the projection optical system PL is measured with a photoelectric sensor (not shown) on the wafer stage WST, for example, before an actual exposure operation. The main control system 25 has previously been stored with a mathematical model, e.g. a differential equation, for calculating an amount of change of image-formation characteristics with respect to the amount of illuminating light. Thus, an amount of change of image-formation characteristics is calculated every moment by monitoring the amount of illuminating light. Correction can be made by the correcting mechanism on the basis of the amount of change of the image-formation characteristics in the same way as in the case of the above-described environmental condition change. Regarding a change of illumination conditions also, correction can be made by calculating an amount of change of image-formation characteristics on the basis of information concerning the rotation angle setting of the driving system 3b for the variable stop 3a.

Next, the arrangement and operation of the second correcting mechanism will be explained in detail. The second correcting mechanism mainly corrects asymmetric image distortion, as has been mentioned above. That is, image-formation characteristics are corrected by distorting the projected image of the reticle R in conformity to the image distortion on the wafer W.

First, the arrangement of the second correcting mechanism will be explained. As shown in FIG. 1, a correcting plate 8 is disposed parallel to the XY-plane at about the middle between the reticle R and the lens element 12 of the projection optical system PL. The correcting plate 8 comprises a transparent optical member, e.g. a glass plate. The correcting plate 8 is adapted to be capable of being selectively inserted and withdrawn by a changing device 21. Thus, the correcting plate 8 is changed for another of correcting plates 24a to 24c stored in a storage unit 23 in the vicinity of the changing device 21, according to need. The correcting plates 8 and 24a to 24c are used to change the shape of an image projected through the projection optical system PL, thereby generating image distortion according to the distortion characteristics of a projection exposure apparatus used in the preceding exposure process or to be used in the subsequent exposure process. The correcting plates 8 and 24a to 24c are also used for the purpose of correcting random distortion difficult to correct by the first correcting mechanism in the projection exposure apparatus of this embodiment used in the present exposure process. It should be noted that the configuration and other features of the correcting plates 8 and 24a to 24c will be described later.

Next, the operation of the second correcting mechanism will be explained with reference to FIGS. 4(a) and 4(b) and FIGS. 5(a) and 5(b). As has been described above, distortion of the projection optical system PL is measured by test exposure or by a method that uses the photoelectric sensor 19, and first corrected by the first correcting mechanism. However, some of the distortion remains uncorrected.

Figure 4A:
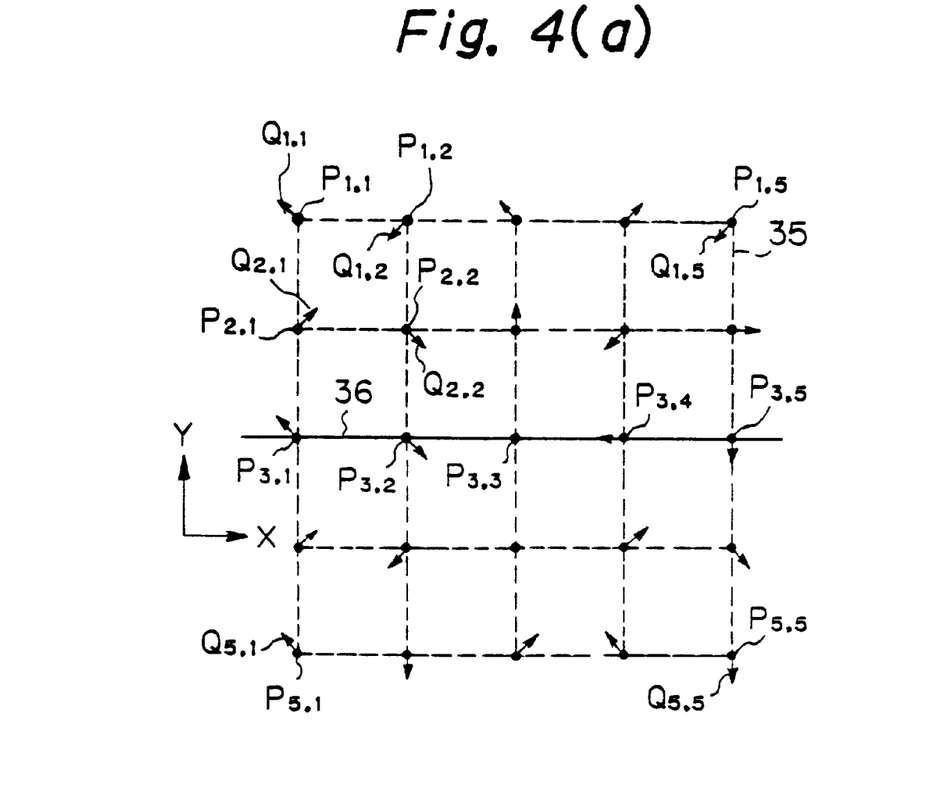

FIG. 4(a) shows one example of residual distortion. In this case, the residual distortion is expressed as pattern displacement on the reticle R. That is, FIG. 4(a) shows the residual distortion of the projected image on the wafer W in terms of the amount of transverse displacement of the pattern on the reticle R. Referring to FIG. 4(a), at each lattice point of an ideal lattice (i.e. a pattern corresponding to a non-distorted lattice-shaped projected image) 35, shown by the dotted lines, there is displacement of the projected image as shown by the arrow. The direction and magnitude of each arrow indicate the direction and magnitude of displacement of the projected image. As shown in FIG. 4(a), there is no consistency in both the direction and magnitude of the arrows; the displacement is distributed at random. For example, four neighboring lattice points $P_{1,1}$, $P_{1,2}$, $P_{2,1}$ and $P_{2,2}$ at the upper-left corner have been displaced to an upper-left point $Q_{1,1}$, a lower-left point $Q_{1,2}$, an upper-right point $Q_{2,1}$, and a lower-right point $Q_{2,2}$, respectively. Thus, the directions of displacement of the neighboring positions are inconsistent with each other. Lattice points $P_{1,5}$, $P_{5,1}$ and $P_{5,5}$ at the other corners have also been displaced to a lower-left point $Q_{1,5}$, an upper-left point $Q_{5,1}$, and a lower point $Q_{5,5}$, respectively. That is, the direction of displacement is random, whether a partial area or the entire area. The magnitude of displacement is also random.

Usually, these asymmetric random image distortion components cannot further be corrected by the conventional methods. In this embodiment, however, the random image distortion components are corrected by using a correcting plate (assumed to be the correcting plate 8 in this case).

Figure 4B:
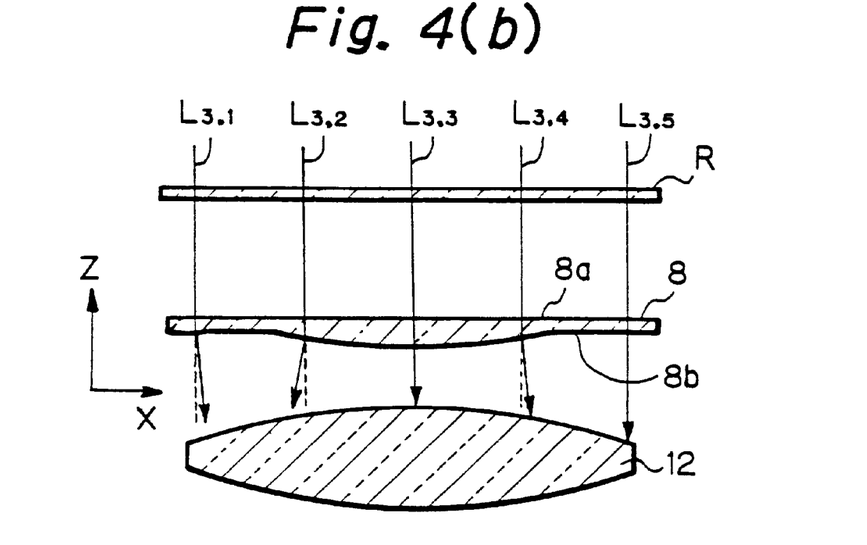

FIG. 4(b) is a sectional view showing the correcting plate 8 as disposed between the reticle R and the projection optical system PL. As shown in FIG. 4(b), the correcting plate 8 has an upper surface 8a formed to be approximately parallel to the reticle R, whereas a lower surface 8b of the correcting plate 8 has been locally curved by polishing such that principal rays passing through the reticle R are bent in directions for canceling distortion. The cross-sectional configuration of the correcting plate 8 illustrated in FIG. 4(b) is one example that is used to correct the distortion of the projected image on the imaginary straight line 36 connecting the central lattice points $P_{3,1}$ to $P_{3,5}$ of the ideal lattice 35 shown in FIG. 4(a). Accordingly, a principal ray $L_{3,1}$ [see FIG. 4(b)] passing through the lattice point $P_{3,1}$ is bent in a direction in which it cancels the upper-leftward displacement at the lattice point $P_{3,1}$, that is, in the lower-rightward direction. Similarly, principal rays $L_{3,2}$ to $L_{3,5}$ passing through the lattice points $P_{3,2}$ to $P_{3,5}$, respectively, are bent in respective directions in which they cancel distortions at the lattice points $P_{3,2}$ to $P_{3,5}$. The whole correcting plate 8 has been polished into a configuration corresponding to the distribution of distortion shown in FIG. 4(a).

By polishing a correcting plate into a predetermined configuration, the corresponding distortion can be corrected. However, if it is intended to correct an excessively large amount of image displacement by the correcting plate 8, the thickness of the correcting plate 8 locally varies to a considerable extent, causing an adverse effect on image plane and spherical aberrations. Therefore, it is preferable to correct symmetric components as much as possible by a conventional method and to correct only the residual components by the correcting plate 8.

In the foregoing, an example in which random distortion is corrected in the projection exposure apparatus according to this embodiment has been explained.

Incidentally, a circuit pattern eventually formed on the wafer W is produced by repeating a series of processes including exposure, etching and vapor deposition. Therefore, a plurality of projection exposure apparatuses are mixedly used. FIG. 1 also shows a projection exposure apparatus 28 used in the preceding exposure process, and a projection exposure apparatus 29 to be used in the subsequent exposure process. That is, the wafer W is successively processed in the projection exposure apparatus 28, the projection exposure apparatus according to this embodiment, and the projection exposure apparatus 29 in the mentioned order, as shown by the arrows.

In this case, there is no reduction of the overlay accuracy due to the difference in distortion even if various different types of projection exposure apparatus are mixedly used, provided that these projection exposure apparatuses are highly effectively corrected for distortion by a correcting plate as in this embodiment. Accordingly, the correcting plate 8 once inserted usually need not be changed. However, when a projection exposure apparatus which is not equipped with a correcting plate such as that in this embodiment is mixedly used, the overlay accuracy is not improved if one projection exposure apparatus alone is highly effectively corrected for distortion. Even in such a case, it is possible according to this embodiment to realize high overlay accuracy by changing correcting plates.

In general, a circuit on the wafer W is formed by stacking a multiplicity of layers of patterns. For a projection exposure apparatus used to form an initial layer (first layer) on the wafer W, there is no preceding exposure process, and there is no restriction on distortion characteristics. Accordingly, it is always possible to use a correcting plate conformable to the distortion characteristics of a projection exposure apparatus to be used in the subsequent exposure process. Thus, it is possible to obtain favorable matching accuracy with a projection exposure apparatus to be used in the subsequent exposure process. It should be noted that, at the second or subsequent layer also, there may be no restriction on distortion characteristics of a projection exposure apparatus used in the preceding exposure process; in such a case also, it is possible to use a correcting plate conformable to the distortion characteristics of a projection exposure apparatus to be used in the subsequent exposure process.

For a projection exposure apparatus used to form a pattern for a second or later layer on the wafer W, it is usually possible to use a correcting plate conformable to the distortion characteristics of a projection exposure apparatus used to form a pattern for the preceding layer. Thus, it is possible to obtain favorable matching accuracy between the projection exposure apparatus used for a second or later layer and the projection exposure apparatus used in the preceding exposure process.

The following is a description of an example in which a correcting plate is used in the system shown in FIG. 1 in conformity to the projection exposure apparatus 28 used for exposure of the wafer W in the preceding exposure process or to the projection exposure apparatus 29 to be used for exposure of the wafer W in the subsequent exposure process.

Prior to an exposure operation, an operator inputs data concerning a projection exposure apparatus with which the image distortion of a wafer W to be exposed this time should be matched, through an input device 27, e.g. a keyboard. A projection exposure apparatus to be selected in this case is either the projection exposure apparatus 28 or 29, and the type of projection exposure apparatus 28 or 29 is input by the operator. On the basis of the input information, the main control system 25 selects the corresponding correcting plate, and instructs the changing device 21 to effect correcting plate replacement. The changing device 21 takes out a designated correcting plate from the storage unit 23 stored with correcting plates 24a, 24b and 24c for replacement produced in conformity to image distortions of projection exposure apparatuses which may be used for overlay exposure, and places the correcting plate at a predetermined position between the reticle R and the projection optical system PL as is the case with the former correcting plate 8. The correcting plate is positioned within a predetermined tolerance by the changing device 21. It should be noted that a desired image distortion can be accurately obtained if a proper correcting plate through which the ideal lattice should be projected is subjected to extra polishing corresponding to an amount of distortion desired, as described above. Accordingly, it is possible to provide a correcting plate capable of coping with a projection exposure apparatus having whatever distortion characteristics. Thus, it is possible to generate an image distortion conformable to any of projection exposure apparatuses for which correcting plates have been prepared, and hence possible to improve the overlay accuracy. It should be noted that correcting plate replacement may be effected by an operator's manual operation in place of the changing device 21.

As has been described above, if all image distortion components are given to a single correcting plate, problems arise; therefore, it is desirable to previously store data concerning symmetric image distortion components in the memory of the main control system 25 for each projection exposure apparatus and to read out the data, according to need, to effect correction mainly by the first correcting mechanism through the image-formation characteristic control system 22 on the basis of the data.

Further, the projection exposure apparatus has an alignment function whereby alignment marks already formed on the wafer W are read to thereby effect positioning of the wafer W to carry out overlay exposure. In the alignment mechanism, for example, alignment marks of some shot areas (sample shots) on the wafer W are read in advance of exposure, and scaling and other errors caused by processing carried out for the wafer W are calculated by a statistical operation, e.g. EGA (Enhanced Global Alignment) method. Then, magnification correction or distortion correction of symmetric components is effected. In this case, it is not conceivable that the shot areas (chips) are distorted at random by the processing; therefore, it is deemed that correction can be satisfactorily made by the conventional method of correcting symmetric distortion components. That is, correction can be made by only the first correcting mechanism. In this case, even if there is a change of symmetric distortion components, e.g. magnification error, in the projection exposure apparatus 28 used in the preceding exposure process, the distortion component in question does not cause an error because it is also included in the measured data. That is, in such a case also, correction can be made satisfactorily, provided that the system has the second correcting mechanism according to this embodiment and a conventional correcting mechanism such as the first correcting mechanism for correcting symmetric components.

It is conceivable to mixedly use projection exposure apparatuses different from each other in the size of the exposure field, that is, the area over which exposure can be effected at a time. In this case, even if projection exposure apparatuses of the same exposure field size have the same symmetric distortion, asymmetric distortion may appear, for example, when overlay exposure is carried out for an exposure area which is ¼ of the exposure field in one of the projection exposure apparatuses. In such a case, the distortion cannot be corrected by the conventional correcting techniques.

Figure 5A:
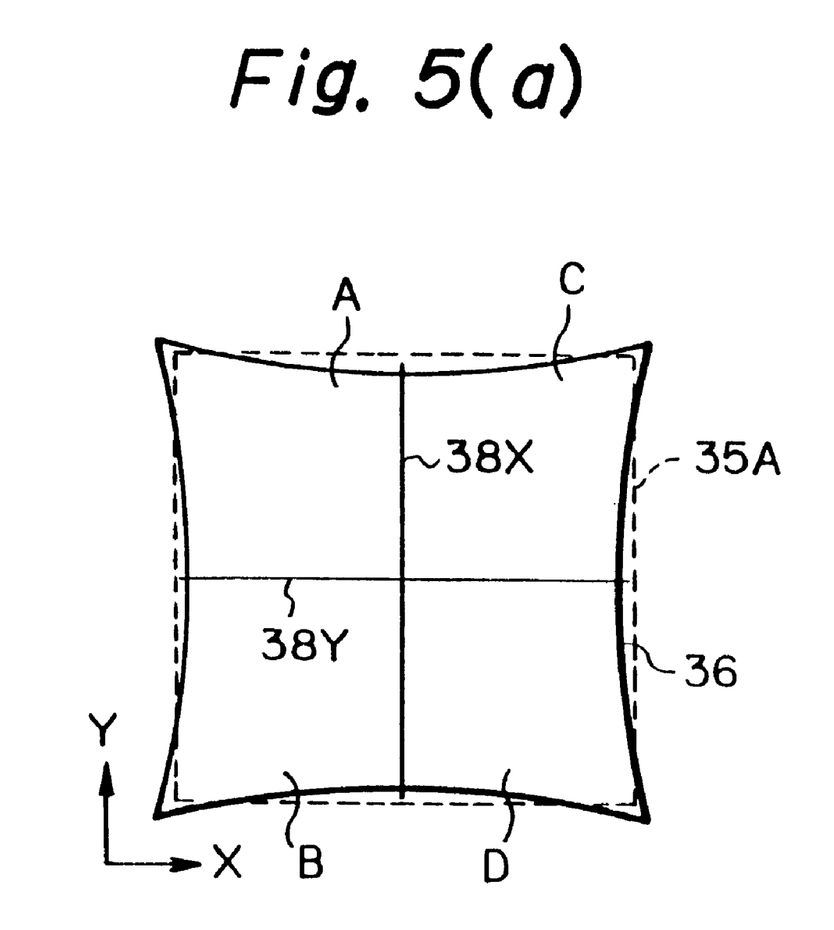
Figure 5B:
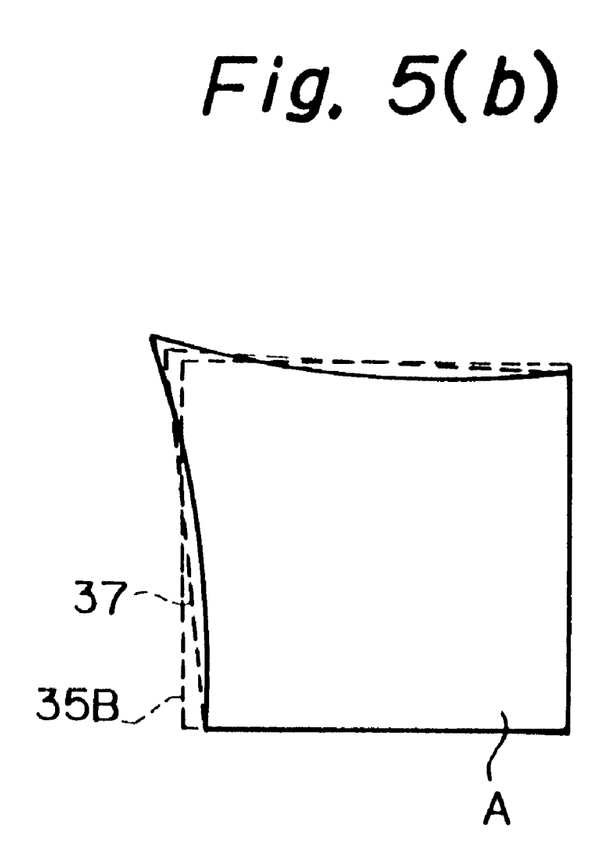

FIGS. 5(a) and 5(b) are views for explanation of asymmetry of distortion in two projection exposure apparatuses (assumed to be a first projection exposure apparatus and a second projection exposure apparatus, respectively) different from each other in the size of the exposure field. FIG. 5(a) shows the condition of distortion in the first projection exposure apparatus. FIG. 5(b) is a view for explanation of a method whereby distortion in the first projection exposure apparatus is corrected in the second projection exposure apparatus. Referring to FIG. 5(a), there is pincushion symmetric distortion between an ideal lattice 35A and a projected image 36 corresponding to the ideal lattice 35A, which is formed by the first projection exposure apparatus. The projected image 36 is divided by lines 38X and 38Y of symmetry in the directions X and Y of the ideal lattice 35A to define projected images A, B, C and D each having an area which is ¼ of that of the projected image 36. As shown in the enlarged view of FIG. 5(b), a projected image 37 is projected over the projected image A by the second projection exposure apparatus. In this case, there is no symmetry in distortion between the projected image A and an ideal lattice 35B in the second projection exposure apparatus; the distortion is asymmetric. Similarly, the remaining three projected images B to D shown in FIG. 5(a) are in asymmetric relation to the second projection exposure apparatus. Such asymmetric distortion can also be corrected by using the correcting plate according to this embodiment.

First, the projected image A is distorted into a rhombic shape like the projected image 37 by a conventional correcting mechanism of the second projection exposure apparatus, which is similar to the above-described first correcting mechanism, for example. Then, the remaining asymmetric components are distorted so as to be corrected by using a correcting plate. The four projected images A to D to be overlaid, which are shown in FIG. 5(a), are similar images 90° rotated relative to each other. Therefore, correction can be made simply by rotating the same correcting plate through 90° for each projected image.

In this embodiment, correction is made by changing the shape of distortion, as described above. Therefore, it is preferable with a view to further improving reliability to carry out exposure while confirming the actual shape of the distortion. For this reason, it is desirable to measure the condition of distortion with the photoelectric sensor 19 in advance of exposure process to make a check as to whether or not the desired distortion has been obtained. By doing so, it is possible to prevent the occurrence of a mistake in replacement of correcting plates or other mistake.

Thus, the method according to this embodiment is useful for a system that mixedly uses a conventional apparatus which is not highly effectively corrected for distortion by a correcting plate. There is no need of a scheme as devised in this embodiment when apparatuses which are satisfactorily corrected for distortion by a correcting plate are mixedly used. In any of the projection exposure apparatuses, exposure is carried out over an ideal lattice almost exactly without any special technique; therefore, one image can be overlaid on another with high accuracy. However, these projection exposure apparatuses are mixed with even a single conventional apparatus which is not highly effectively corrected for distortion, the overlay accuracy reduces. However, images can be overlaid without a problem if the image distortion of another apparatus is corrected in conformity to the image distortion of the present apparatus. In particular, when a plurality of conventional projection exposure apparatuses are mixedly used, it is preferable to carry out exposure in conformity to each image distortion before or after a process step at which very high overlay accuracy is not required, and to overlay images different in the shape of image distortion at a step where very high accuracy is not required. When a plurality of conventional apparatuses mixedly used are similar to each other in image distortion characteristics to a certain extent, it is conceivable to generate image distortion in conformity to the average of the image distortion characteristics of the apparatuses. It is also possible to group projection exposure apparatuses by similarity in image distortion characteristics and to properly use them before or after a process at which very high accuracy is not required.

It should be noted that, according to a method wherein a correcting plate which realizes an approximately ideal lattice is further processed so as to provide desired image distortion, a correcting plate that generates the same image distortion as that of a certain apparatus is one that is unique to each particular projection exposure apparatus to which this embodiment is applicable. Therefore, it is necessary to prepare a large number of correcting plates. To solve this problem, it is preferable to employ an arrangement in which a correcting plate for overlay correction is inserted above or below a proper correcting plate for realizing an ideal lattice. By doing so, a correcting plate that generates the same image distortion as that of a certain apparatus is made common to all the apparatuses. Accordingly, the number of correcting plates to be prepared can be reduced to a considerable extent.

In recent projection exposure apparatuses, illumination conditions can be changed by a variable stop (i.e. the variable stop 3a in FIG. 1) for improving the resolution, as has been described above. A change of illumination conditions causes a change of the path of light rays in the projection optical system. Consequently, distortion is changed by the effect of subtle nonuniformity in the projection optical system. In other words, a change of illumination conditions causes the distortion to become one that is inherent in another projection optical system. The correcting plate according to this embodiment is also useful in such a case. The correcting plate can contribute to improvement in the overlay accuracy in a case where exposure conditions, e.g. illumination conditions, are different even in the same projection exposure apparatus. Accordingly, even in the case of a single projection exposure apparatus, it is desirable to use correcting plates produced distinctively in conformity to various illumination conditions. It is, of course, unnecessary to apply this embodiment in a case where the amount of change of random components, among distortion changes due to illumination condition change, is sufficiently small and hence ignorable.

When the distortion characteristics of the projection optical system are changed due to maintenance or any other operation carried out for the projection exposure apparatus, it is necessary to correct the correcting plate or to produce a new correcting plate.

The method according to this embodiment needs to control information used between a plurality of projection exposure apparatuses; therefore, it is desirable for the information to be controlled by a host computer capable of controlling the whole exposure system.

It should be noted that the present invention is similarly applicable not only to stepper-type projection exposure apparatuses but also to scanning projection exposure apparatuses, e.g. step-and-scan type apparatuses, in which a pattern formed on a reticle is sequentially transferred onto a wafer by synchronously scanning the reticle and the wafer.

In the projection exposure apparatus according to the present invention, an optical member which generates image distortion according to image distortion characteristics of another projection exposure apparatus is inserted in between a mask and a projection optical system, thereby enabling image distortion of the projection optical system to match image distortion produced in the other projection exposure apparatus. Accordingly, high overlay accuracy can be obtained even in a case where the projection exposure apparatus according to the present invention is mixedly used with a projection exposure apparatus in which, for example, asymmetric random image distortion remains.

In a case where a device for selectively inserting and withdrawing the optical member is provided, the optical member can be speedily and accurately positioned or changed by the optical member inserting and withdrawing device in accordance with each particular projection exposure apparatus used.

In a case where the other projection exposure apparatus is one used in the preceding exposure process, image distortion in the projection exposure apparatus used in the preceding exposure process is corrected, and thus favorable matching accuracy can be obtained between the present projection exposure apparatus and the apparatus used in the preceding exposure process.

In a case where the other projection exposure apparatus is one that is to be used in the subsequent exposure process, because the optical member generates image distortion according to image distortion characteristics of the projection exposure apparatus to be used in the subsequent exposure process, favorable matching accuracy can be obtained between the present projection exposure apparatus and the apparatus to be used in the subsequent exposure process.

It should be noted that the present invention is not necessarily limited to the above-described embodiment, but may adopt various arrangements without departing from the gist of the present invention.

What is claimed is:

1. An exposure apparatus which exposes a second object with an energy beam irradiated on a first object, comprising:
   an illumination optical system disposed on an optical pass through which the energy beam passes to illuminate the first object with the energy beam;
   a projection optical system of which a movable optical element is arranged along an optical axis thereof to project the energy beam from the first object onto the second object;
   an actuator installed within the projection optical system to adjust symmetrical distortion of the projection optical system by movement of the movable optical element; and
   an optical member provided between the first object and the movable optical element to correct asymmetrical distortion of the projection optical system.

2. An apparatus according to claim 1, further comprising:
   an adjusting system connected to said actuator and a light detector having a light receiving surface, on which said energy beam is incident, arranged at an image plane side of said projection optical system to move said movable optical element based on an output of the light detector.

3. An apparatus according to claim 2, wherein
   said adjusting system moves said first object to adjust image characteristics of said projection optical system.

4. A method of manufacturing a device including a step of transferring a pattern onto a substrate by using the exposure apparatus of claim 1.

5. A method for making an exposure apparatus in which a second object is exposed with an energy beam irradiated on a first object, comprising:
   providing an illumination optical system on an optical pass through which the energy beam passes to illuminate the first object with the energy beam;
   providing a projection optical system of which a movable optical element is arranged along an optical axis thereof to project the energy beam from the first object onto the second object;
   installing an actuator within the projection optical system to adjust symmetrical distortion of the projection optical system by movement of the movable optical element; and
   providing an optical member between the first object and the movable optical element to correct asymmetrical distortion of the projection optical system.

6. A method of exposing a second object through a projection optical system, with an energy beam irradiated on a first object, comprising:
   adjusting symmetrical distortion of the projection optical system by movement of a movable optical element installed within the projection optical system; and
   correcting by an optical member disposed between the first object and the movable optical element, asymmetrical distortion of the projection optical system.

7. A method according to claim 6, further comprising:
   receiving said energy beam passing through said projection optical system to detect distortion of said projection optical system, whereby said movable optical element is moved based on the detected distortion.

8. A method of manufacturing a device including a step of transferring a pattern onto a substrate by the exposing method of claim 6.

9. An exposure apparatus wherein a pattern formed on a first object is projected onto a second object through a projection optical system, comprising:

an optical member provided between said first object and said projection optical system to generate asymmetrical image distortion according to image distortion characteristics of another exposure apparatus used to carry out exposure for said second object; and an adjusting system, an actuator of which is installed within said projection optical system to move at least one optical element of said projection optical system, the adjusting system generating symmetrical image distortion according to the image distortion characteristics of said another exposure apparatus by moving the at least one optical element.

10. An exposure apparatus according to claim 9, further comprising:

a device for selectively inserting and withdrawing said optical member into and from a bundle of image-forming light rays between said first object and said projection optical system.

11. An exposure apparatus according to claim 9, wherein said another exposure apparatus is an exposure apparatus used in a preceding exposure process.

12. An exposure apparatus according to claim 9, wherein said another exposure apparatus is an exposure apparatus to be used in a subsequent exposure process.

13. An exposure apparatus according to claim 9, wherein said another exposure apparatus is a projection exposure apparatus in which asymmetric random distortion remains.

14. An exposure apparatus according to claim 9, wherein said optical member is a transparent glass plate which has been polished so as to be capable of correcting random distortion.

15. An exposure apparatus according to claim 9, further comprising:

a storage unit which stores a plurality of optical members; and a changing device which changes said optical member provided between said first object and said projection optical system for a predetermined optical member stored in said storage unit.

16. An exposure apparatus according to claim 15, further comprising:

an input device which inputs information concerning a type of said another exposure apparatus; and a main control system which instructs said changing device to select an optical member corresponding to the information input through said input device from among said plurality of optical members stored in said storage unit.

17. An exposure apparatus according to claim 9, wherein said exposure apparatus has an exposure field, and said another exposure apparatus has an exposure field, said exposure field of said exposure apparatus and said exposure field of said another exposure apparatus being different in size from each other.

18. An exposure apparatus according to claim 9, wherein said exposure apparatus is different in an illumination condition from said another exposure apparatus.

19. An exposure method in which patterns are overlaid on a substrate by using first and second exposure apparatus, comprising:

disposing to said first exposure apparatus an optical member which generates change of asymmetrical pattern image according to an image-formation characteristic of said second exposure apparatus;

moving at least one optical element of a projection optical system in said first exposure apparatus to generate a change in symmetrical pattern image according to the image-formation characteristics of said second exposure apparatus; and forming the changed pattern image on said substrate through said optical member and said projection optical system by using said first exposure apparatus.

20. An exposure method according to claim 19, wherein said first exposure apparatus is used after said second exposure apparatus is used to form said pattern on said substrate.

21. An exposure method according to claim 19, wherein said first exposure apparatus is used before said second exposure apparatus is used to form said pattern on said substrate.

22. An exposure method according to claim 19, wherein said first exposure apparatus includes a plurality of optical members which changes the image of said pattern, and wherein said first exposure apparatus selects at least one optical member from among said plurality of optical members according to the image-formation characteristic of said second exposure apparatus.

23. An exposure method according to claim 19, wherein said optical member corrects asymmetric image distortion.

24. An exposure method according to claim 19, further comprising inputting information from said second exposure apparatus to said first exposure apparatus.

25. An exposure method according to claim 19, wherein said first and second exposure apparatuses differ from each other in the size of an exposure field thereof.

26. An exposure apparatus which exposes a second object with an energy beam irradiated on a first object, comprising:

a projection optical system, a plurality of optical elements of which are arranged along an optical axis thereof to project the energy beam from the first object onto the second object;

an adjusting system, an actuator of which is installed within the projection optical system to adjust symmetrical aberration of the projection optical system by movement of at least one of the plurality of optical elements; and an optical member provided between the first object and the at least one optical element to correct asymmetrical aberration of the projection optical system.

27. An apparatus according to claim 26, wherein said optical member is an optical plate, a surface of which is polished.

28. An apparatus according to claim 27, wherein said optical member corrects random distortion as the asymmetrical aberration of said projection optical system.

29. An apparatus according to claim 28, wherein said adjusting system adjusts at least one of field curvature, astigmatism and distortion as the symmetrical aberration of said projection optical system.

* * * * *

UNITED STATES PATENT AND TRADEMARK OFFICE
CERTIFICATE OF CORRECTION

PATENT NO. : 6,333,776 B1
DATED : December 25, 2001
INVENTOR(S) : Tetsuo Taniguchi It is certified that error appears in the above-identified patent and that said Letters Patent is hereby corrected as shown below:

<u>Title page,</u>
Item [30], Foreign Application Priority Data, add the following
-- March 29, 1994 (JP) ................................. 6-58932
June 16, 1994 (JP) ................................. 6-134007 --.

Signed and Sealed this

Thirteenth Day of August, 2002

Attest:

JAMES E. ROGAN
Attesting Officer     Director of the United States Patent and Trademark Office